US012663496B2

(12) United States Patent
Weiss et al.

(10) Patent No.: US 12,663,496 B2
(45) Date of Patent: Jun. 23, 2026

(54) CALIBRATION SYSTEM AND INTERFACING METHOD WITH A PORT CALIBRATION UNIT FOR EACH PORT

(71) Applicant: Rohde & Schwarz GmbH & Co. KG, Munich (DE)

(72) Inventors: Markus Weiss, Bottrop (DE); Marc Lenkeit, Solingen (DE); Maximilian Friesinger, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 158 days.

(21) Appl. No.: 18/583,482

(22) Filed: Feb. 21, 2024

(65) Prior Publication Data

US 2025/0264567 A1      Aug. 21, 2025

(51) Int. Cl.
*G01R 35/00* (2006.01)

(52) U.S. Cl.
CPC ................................. *G01R 35/007* (2013.01)

(58) Field of Classification Search
CPC ....... H04L 43/00; H04L 1/24; H04L 43/0817; H04L 43/0847; H04L 43/0811; H04L 41/064; H04L 12/66; H04L 43/50; H04L 9/3247; G06F 18/217; G06F 17/18; G06F 3/0418; G06F 18/20; H04B 17/29; H04B 3/46; H04B 17/11; H04B 17/19; G01R 35/005; G01R 35/00; G01R 31/3191; G01R 31/00; G01R 31/31709
See application file for complete search history.

(56) References Cited

U.S. PATENT DOCUMENTS

| | | | |
|---|---|---|---|
| 5,578,932 A | 11/1996 | Adamian | |
| 6,347,382 B1 * | 2/2002 | Nakayama | G01R 27/28 |
| | | | 714/37 |
| 7,030,625 B1 | 4/2006 | Boudiaf et al. | |
| 7,034,548 B2 | 4/2006 | Anderson | |
| 7,359,814 B1 * | 4/2008 | Nakayama | G01R 35/005 |
| | | | 702/85 |
| 8,686,711 B2 * | 4/2014 | Tanaka | H01J 37/32935 |
| | | | 216/84 |
| 10,794,837 B2 | 10/2020 | Ziegler | |
| 11,509,404 B2 * | 11/2022 | Friesinger | H04B 17/11 |
| 12,130,351 B2 * | 10/2024 | Friesinger | G01R 27/28 |
| 12,461,181 B2 * | 11/2025 | Bresser | G01R 27/32 |

* cited by examiner

*Primary Examiner* — Vinh P Nguyen

(74) *Attorney, Agent, or Firm* — Patterson + Sheridan, LLP; Carleton S. Clauss

(57) ABSTRACT

A calibration system for a measurement application device is described where the calibration system includes a port calibration unit for each one of at least two ports of the measurement application device, and a central switching unit that includes an input port for each one of the port calibration units and controllably couples at least two of the input ports to each other in pairs. Moreover, each one of the port calibration units includes a device coupling port for coupling the respective port calibration unit to the respective port of the measurement application device, and a central coupling port for coupling the respective port calibration unit to the respective input port of the central switching unit. Also, each one of the port calibration units includes a calibration section, and a switching section. The present disclosure further provides a respective method.

16 Claims, 9 Drawing Sheets

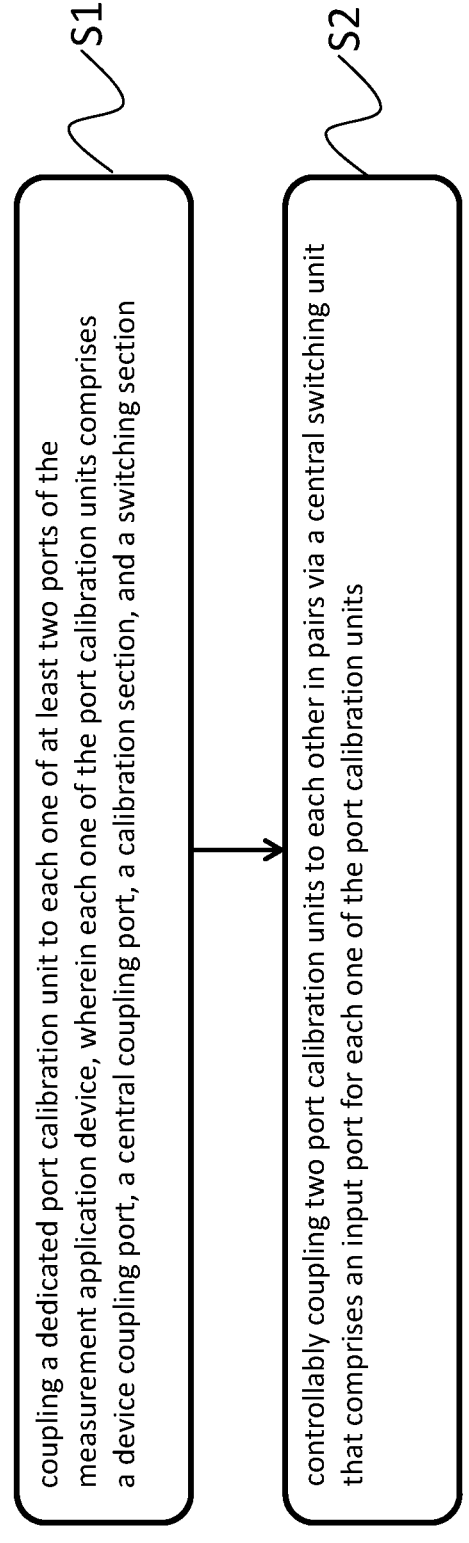

coupling a dedicated port calibration unit to each one of at least two ports of the measurement application device, wherein each one of the port calibration units comprises a device coupling port, a central coupling port, a calibration section, and a switching section

S1 controllably coupling two port calibration units to each other in pairs via a central switching unit that comprises an input port for each one of the port calibration units

CALIBRATION SYSTEM AND INTERFACING METHOD WITH A PORT CALIBRATION UNIT FOR EACH PORT

TECHNICAL FIELD

The disclosure relates to a calibration system, and a respective interfacing method.

BACKGROUND

Although applicable to any type of measurement application device, the present disclosure will mainly be described in conjunction with high frequency measurement application devices that require calibration prior to performing a measurement.

When developing electronic devices, especially devices operating with signals that comprise frequencies up to multiple GHz, developers need to perform extensive measurements to make sure that the respective device operates as expected and complies with respective regulations.

The required measurement equipment usually requires time-consuming and complex calibrations prior to performing a measurement.

Accordingly, there is a need for simplifying RF measurements.

SUMMARY

The above stated problem is solved by the features of the independent claims. It is understood, that independent claims of a claim category may be formed in analogy to the dependent claims of another claim category.

Accordingly, it is provided:

A calibration system for a measurement application device or multiple measurement application devices, the calibration system comprising a port calibration unit for each one of at least two ports of the measurement application device, and a central switching unit that comprises an input port for each one of the port calibration units and controllably couples at least two of the input ports to each other in pairs, or disconnects at least two of the input ports from each other, wherein each one of the port calibration units comprises a device coupling port for coupling the respective port calibration unit to the respective port of the measurement application device, and a central coupling port for coupling the respective port calibration unit to the respective input port of the central switching unit, and wherein each one of the port calibration units comprises a calibration section providing at least three calibration standards, and a switching section for controllably coupling the device coupling port of the respective port calibration unit or the central coupling port of the respective port calibration unit to one of the at least three calibration standards, or for coupling the device coupling port of the respective port calibration unit to the central coupling port of the respective port calibration unit.

Further, it is provided:

An interfacing method for a measurement application device, the interfacing method comprising coupling a dedicated port calibration unit to each one of at least two ports of the measurement application device, and controllably coupling two port calibration units to each other in pairs via a central switching unit that comprises an input port for each one of the port calibration units, wherein each one of the port calibration units comprises a device coupling port that couples the respective port calibration unit to the respective port of the measurement application device, and a central coupling port that couples the respective port calibration unit to the respective input port of the central switching unit, and wherein each one of the port calibration units comprises a calibration section that comprises at least three calibration standards, and a switching section that controllably couples the device coupling port of the respective port calibration unit or the central coupling port of the respective port calibration unit to one of the at least three calibration standards, or that couples the device coupling port of the respective port calibration unit to the central coupling port of the respective port calibration unit.

The present disclosure is based on the finding that calibrating a measurement application device, for example a vector network analyzer, also called VNA, with more than a single port e.g., with two or more ports, requires a complex calibration setup. Such a calibration setup may be difficult to set-up correctly for a user. The user is, for example, required to attach cables to the ports of the measurement application device and the calibration standards at a predefined torque. This is especially true for high frequency RF measurement application devices like VNAs that operate in a frequency range of more than 25 GHz, for example, 60 GHz, 70 GHz or more. Generally, in the context of the present disclosure the term high frequency ranges or high frequencies is meant to encompass frequencies of about 25 GHz or more, like 30 GHz, 40 GHz, 50 GHZ, 60 GHz, or 70 GHz or more.

The present disclosure is further based on the finding that automating the calibration of measurement application devices that operate with high frequency ranges is not possible with traditional setups that comprise a plurality of switches in the signal lines, each switch adding losses and attenuating the signals.

The present disclosure, therefore, provides a calibration system for measurement application devices that may perform an automated calibration for RF signals that comprises high frequencies of up to 70 GHz or more, as mentioned above. The disclosure may be applied to calibrate e.g., to VNAs (Vector Network Analyzer), oscilloscopes, signal analyzers, or any other type of measurement application device that may be calibrated.

To this end, the present disclosure provides the calibration system for a measurement application device. Usually such a measurement application device may comprise two or more, like three or four ports. Measurement application devices may also comprise more than four ports, like five, six, seven, eight or more ports. In respective measurement applications, the calibration system may also be used with and be coupled to multiple different measurement application devices. In any case, a single port calibration unit is provided for each port of one or multiple measurement application devices that are to be calibrated.

The calibration system comprises a port calibration unit for each port of the measurement application device. Further, the calibration system comprises a central switching unit.

Each port calibration unit may be coupled to the respective port of the measurement application device via a respective device coupling port of the port calibration unit. Further, each port calibration unit may be coupled to an input port of the central switching unit via a respective central coupling port.

The central switching unit may controllably couple two of the input ports to each other. The central switching unit may also couple multiple pairs of input ports to each other. However, the central switching unit may only couple pairs of input ports, and therefore, port calibration units to each other, such that other port calibration units are not influenced by the signals transmitted between the two port calibration units that are connected as pair.

The single port calibration units each provide at least three calibration standards, and a respective switching section. The switching section provides at least three switching functions. The switching section may couple the device coupling port to any one of the calibration standards. The switching section may also couple the central coupling port to any one of the calibration standards. Further, the switching section may also couple the device coupling port to the central coupling port, without coupling any one of the ports to a calibration standard. The respective switching elements may be opened or no electrical connection may be established.

With this arrangement, the calibration system allows providing the calibration standards directly at the respective port of the measurement application device. This may be achieved by not switching the central coupling port of a port calibration unit to any other element, and switching or coupling the device coupling port of the respective port calibration unit to the respective calibration standard.

At the same time, the calibration system allows providing the calibration standards on the other end of a signal path that starts at a first port of the measurement application device and ends at a second port of the measurement application device. To this end, in the port calibration unit of the first port the device coupling port and the central coupling port may be coupled to each other. Further, in the port calibration unit of the second port, the central coupling port may couple to a respective one of the calibration standards, and the device coupling port may not be coupled to any other element. Of course, the same configuration may be used in the other direction from the second port to the first port.

In the context of the present disclosure, the term switch or switching element or any other term that refers to an element that may operate as an electrical switch may comprise any adequate electrical element. Such switching elements may e.g., comprise semiconductor switches, like FETs, and bipolar transistors, Aluminum-Gallium-Arsenide switches, Indium-Phosphide switches, or CMOS switches, but are not limited to these embodiments. Further, the term switch or switching element or any other term that refers to an element that may operate as an electrical switch may comprise a single or multiple switches arranged at least one of in series, and in parallel.

In embodiments, at least parts of the calibration system, especially the single port calibration units, may be integrated into the measurement application device. In such embodiments, the port calibration units may be provided as part of or integrated into the single ports of the measurement application device.

A measurement application device according to the present disclosure may comprise any device that may be used in a measurement application to acquire an input signal or to generate an output signal, or to perform additional or supporting functions in a measurement application. A measurement application device may also comprise or be implemented as program application or program applications, also called measurement program application or measurement program applications, that may be executed on a computer device and that may communicate with other measurement application devices in order to perform a measurement task. A measurement application, also called measurement setup, may e.g., comprise at least one or multiple different measurement application devices for performing electric, magnetic, or electromagnetic measurements, especially on single devices under test. Such electric, magnetic, or electromagnetic measurements may e.g., be performed in a measurement laboratory or in a production facility in the respective production line. An exemplary measurement application or measurement setup may serve to qualify the single devices under test i.e., to determine the proper electrical operation of the respective devices under test.

Measurement application devices to this end may comprise at least one signal acquisition section for acquiring electric, magnetic, or electromagnetic signals to be measured from a device under test, or at least one signal generation section for generating electric, magnetic, or electromagnetic signals that may be provided to the device under test. Such a signal acquisition section may comprise, but is not limited to, a front-end for acquiring, filtering, and attenuating or amplifying electrical signals. The signal generation section may comprise, but is not limited to, respective signal generators, amplifiers, and filters. In embodiments, the signal acquisition is performed via the signal acquisition section in a wired or contact-based manner or fashion. To this end, a respective measurement probe may be coupled to the measurement application device via a respective cable. In embodiments, the signal generation and emission is performed via the signal generation section in a wired or contact-based manner or fashion. To this end, a respective signal output probe may be coupled to the measurement application device via a respective cable, or the signal may be output directly via the cable e.g., to a device under test.

Further, when acquiring signals, measurement application devices may comprise a signal processing section that may process the acquired signals. Processing may comprise converting the acquired signals from analog to digital signals, and any other type of digital signal processing, for example, converting signals from the time-domain into the frequency-domain.

The measurement application devices may also comprise a user interface to display the acquired signals to a user and allow a user to control the measurement application devices. Of course, a housing may be provided that comprises the elements of the measurement application device. It is understood, that further elements, like power supply circuitry, and communication interfaces may be provided.

A measurement application device may be a stand-alone device that may be operated without any further element in a measurement application to perform tests on a device under test. Of course, communication capabilities may also be provided for the measurement application device to interact with other measurement application devices.

A measurement application device may comprise, for example, a signal acquisition device e.g., an oscilloscope, especially a digital oscilloscope, a spectrum analyzer, or a vector network analyzer. Such a measurement application device may also comprise a signal generation device e.g., a signal generator, especially an arbitrary signal generator, also called arbitrary waveform generator, or a vector signal generator. Further possible measurement application devices comprise devices like calibration standards, or measurement probe tips.

Of course, at least some of the possible functions, like signal acquisition and signal generation, may be combined in a single measurement application device.

In embodiments, the measurement application device may comprise pure data acquisition devices that are capable of acquiring an input signal and of providing the acquired input signal as digital input signal to a respective data storage or application server. Such pure data acquisition devices not necessarily comprise a user interface or display. Instead, such pure data acquisition devices may be controlled remotely e.g., via a respective data interface, like a network interface or a USB interface. The same applies to pure signal generation devices that may generate an output signal with-out comprising any user interface or configuration input elements. Instead, such signal generation devices may be operated remotely via a data connection.

By allowing to flexibly provide calibration standards on any end of a signal path in a measurement application, the calibration system allows for an easy and quick calibration of a measurement application device, especially for RF measurement applications.

Further embodiments of the present disclosure are subject of the further dependent claims and of the following descrip-tion, referring to the drawings.

In the following, the dependent claims referring directly or indirectly to claim 1 are described in more detail. For the avoidance of doubt, the features of the dependent claims relating to independent claim 1 can be combined in all variations with each other and the disclosure of the descrip-tion is not limited to the claim dependencies as specified in the claim set. Further, the features of the other independent claims referring to independent claim 1 may be combined with any of the features of the other independent claims or the dependent claims relating to any one of the other independent claims. In a respective method, respective method steps may perform the function of the respective apparatus elements, and in a respective apparatus, respective apparatus elements may perform the respective method steps.

In an embodiment, which can be combined with all other embodiments mentioned above or below, the central switch-ing unit may comprise a ring structure with a port coupling for each one of the input ports, wherein each one of the input ports may be coupled to a respective one of the port couplings of the ring structure.

The expression or term "ring structure" in this regard refers to the central switching unit comprising electrical traces that are arranged in a ring-like structure. In this context, "ring-like" refers only to the electrical connections, not to the mechanical or geometrical arrangement of the traces.

The ring structure, therefore, electrically couples the port couplings in a ring. As will be explained below, respective switching elements may be provided in the ring structure to controllably couple single pairs of the port couplings to each other.

A port coupling is provided for each one of the input ports i.e., for each one of the port calibration units. The central coupling ports of the single port calibration units are each coupled to a respective one of the input ports.

With this arrangement, all the port calibration units are coupled to the ring structure, and may be controllably coupled to each other via the ring structure easily. No complex switching matrix is required with the ring structure.

In another embodiment, which can be combined with all other embodiments mentioned above or below, the ring structure may comprise a ring switching element between each two of the port couplings for controllably closing or opening the ring structure between the respective port cou-plings.

A ring switching element is provided between each pair of two port couplings that are consecutively arranged in the ring structure. The ring switching elements, therefore, allow to open or close the ring structure electrically between each pair of consecutive port couplings.

In an exemplary arrangement, the calibration system may comprise four port calibration units. In such an arrangement, the ring structure will comprise four input ports coupled to four port couplings, and a ring switching element between each pair of consecutive port couplings.

In such an arrangement, it is for example possible to close the ring switching elements between the first port coupling, and the second port coupling to electrically couple the first port coupling to the second port coupling. It is also possible, for example, to close the ring switching elements between the first port coupling, the second port coupling, and the third port coupling to electrically couple the first port coupling to the third port coupling, and so on.

At the same time, the number of switches for flexibly coupling any one of the port couplings and therefore, the port calibration units, to each other, is significantly reduced compared to known switching matrixes.

By reducing the number of switches, the attenuation in the signal path may also be significantly reduced and signals with increased frequencies may be processed.

In a further embodiment, which can be combined with all other embodiments mentioned above or below, the ring structure may comprise a port switching element between the port couplings and the respective input ports for con-trollably coupling each one of the input ports to the respec-tive port coupling or decoupling the respective input port from the respective port coupling.

The port switching elements may be provided without or together with the ring switching elements.

With the port switching elements alone, the ring structure is always electrically closed as a ring, or at least ring-like or ring-segment-like with an opening between two of the port couplings.

When used in conjunction with the ring switching ele-ments, a connection between two of the input ports may be established by closing the respective ring switching ele-ments e.g., as explained above, and closing the respective port switching elements.

Without the ring switching elements, the single input ports may be coupled to each other by closing the respective two port switching elements, and opening the other port switching elements.

In embodiments, each one of the port switching elements may comprise a switch for coupling the respective input port to the respective port coupling, and another switch for connecting the respective input port to a defined potential e.g., ground, when the respective input port is not coupled to the respective port coupling.

In a further embodiment, which can be combined with all other embodiments mentioned above or below, the port calibration units and the central switching unit may be provided as dedicated circuit elements at least one of on separate substrates and coupled to each other by cables, and on the same substrate and coupled to each other by traces provided on the substrate.

In embodiments all the port calibration units, and the central switching unit may be provided as dedicated circuit or electrical elements or components, and may be coupled to each other by respective cables.

The port calibration units may e.g., be provided each in a dedicated housing with respective connectors e.g., BNC-style or coaxial connectors. The port calibration units may also be provided in the respective measurement application device, especially as part of the signal acquisition and output circuitry of the single ports of the measurement application device.

In other embodiments, at least some of the port calibration units may be provided on a single substrate together with the central switching unit. In such an embodiment, the single port calibration units, and the central switching unit may each be provided as a single integrated circuit and may be mounted on a common substrate. In an embodiment, all of the port calibration units, and the central switching unit may be provided on the same substrate and especially, with a single housing that comprises respective connectors.

Providing single elements for the port calibration units, and the central switching unit also allows easily exchanging defective port calibration units, or a defective central switching unit.

In an exemplary embodiment, the port calibration units and the central switching unit may be provided on a single substrate or PCB. A single IC or chip may be provided for each one of the port calibration units. For example, four ICs or chips may be provided to implement four port calibration units. The central switching unit may be provided by a further dedicated IC or chip, or may be implemented via discrete circuit elements on the PCB. Since all ICs, Chips or circuit elements are provided on the same PCB, no cables are required, and all electrical connections may be implemented as traces on the PCB.

In another embodiment, which can be combined with all other embodiments mentioned above or below, the port calibration units and the central switching unit may be provided in a single element.

By providing all port calibration units, and the central switching unit in the same element e.g., in the same integrated circuit, a fully integrated calibration system may be provided. The length of signal traces, and the attenuation of signals may be minimized.

In an embodiment, which can be combined with all other embodiments mentioned above or below, the single element may comprise a Monolithic Microwave Integrated Circuit.

A Monolithic Microwave Integrated Circuit is a type of integrated circuit that has the capability of accommodating all the elements required to provide a calibration system that may operate on signal with frequencies of up to 70 GHz or more.

In a further embodiment, which can be combined with all other embodiments mentioned above or below, the Monolithic Microwave Integrated Circuit may comprise a rectangular shape, and the central switching unit may be provided in the center of the rectangular shape, and the port calibration units may be provided in corners of the rectangular shape or on the sides of the rectangular shape.

By providing the central switching unit in the center of the Monolithic Microwave Integrated Circuit, and the port calibration units around the central switching unit, the port calibration units may easily be interfaced with the central switching unit.

In another embodiment, which can be combined with all other embodiments mentioned above or below, the at least three calibration standards may comprise at least one of an open calibration standard, a short calibration standard, a match calibration standard, and a high reflection calibration standard.

By providing at least an open calibration standard, a short calibration standard, and a match calibration standard, it is easily possible to implement a calibration of the measurement application device with the calibration system.

Performing the calibration may comprise determining the S-parameters for the single ports or port combinations and applying respective calibration coefficients during operation of the measurement application device.

The high reflection calibration standard may be implemented e.g., to perform a noise figure measurement.

In an embodiment, which can be combined with all other embodiments mentioned above or below, the calibration system may further comprise a controller that controls at least one of the port calibration units, and the central switching unit.

The controller may comprise any type of controllable or programmable device that may be used to control any type of switch or switching element or element that may operate as an electrical switch. The controller may comprise a respective data interface or digital interface that allows providing respective control commands to the controller e.g., from the measurement application device that is to be calibrated. A fully automatic calibration that is controlled by the measurement application device is, therefore, easily possible.

A controller respective may comprise or may be provided in or as part of at least one of a dedicated processing element e.g., a processing unit, a microcontroller, a field programmable gate array, FPGA, a complex programmable logic device, CPLD, an application specific integrated circuit, ASIC, or the like. A respective program or configuration may be provided to implement the required functionality. The controller may at least in part also be provided as a non-transitory computer program product comprising computer readable instructions that may be executed by a processing element. In a further embodiment, the controller may be provided as addition or additional function or method to the firmware or operating system of a processing element that is already present in the respective application as respective computer readable instructions. Such computer readable instructions may be stored in a memory that is coupled to or integrated into the processing element. The processing element may load the computer readable instructions from the memory and execute them.

In addition, it is understood, that any required supporting or additional hardware may be provided like e.g., a power supply circuitry and clock generation circuitry.

Generally, any computer program or computer program product disclosed herein is to be understood as a non-transitory computer program product.

DESCRIPTION OF THE DRAWINGS

For a more complete understanding of the present disclosure and advantages thereof, reference is now made to the following description taken in conjunction with the accompanying drawings. The disclosure is explained in more detail below using exemplary embodiments which are specified in the schematic figures of the drawings, in which:

FIG. 7 shows a schematic flow diagram of an embodiment of a method according to the present disclosure;

In the figures like reference signs denote like elements unless stated otherwise.

DETAILED DESCRIPTION

Figure 1:
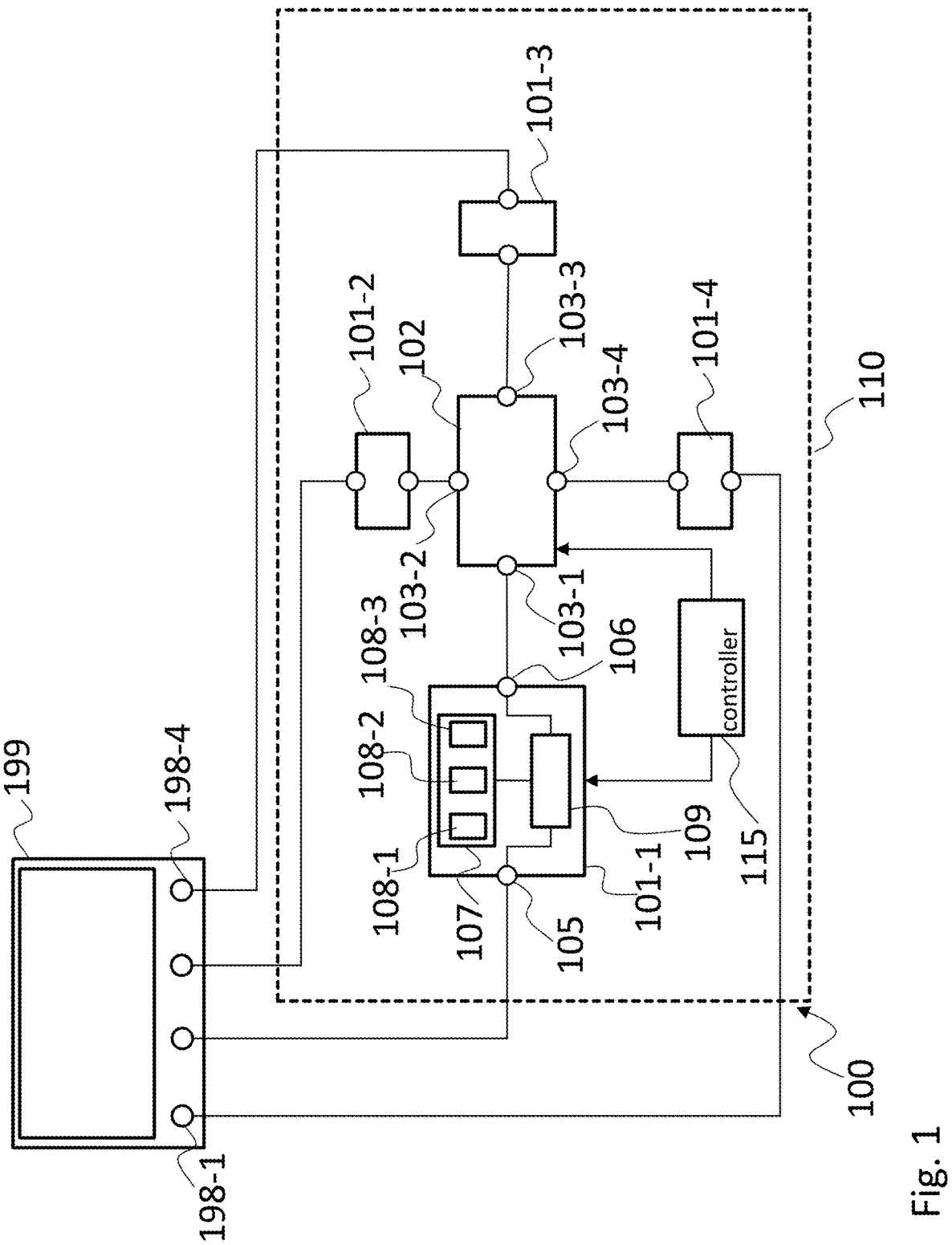
FIG. 1 shows a schematic block diagram of an embodiment of a calibration system according to the present disclosure.

FIG. 1 shows a schematic block diagram of a calibration system 100 for a measurement application device 199 that comprises four exemplary ports 198-1-198-4. The calibration system 100 comprises a port calibration unit 101-1, 101-2, 101-3, 101-4 for each port 198-1-198-4 of the measurement application device 199. Further, a central switching unit 102 is provided that comprises an input port 103-1, 103-2, 103-3, 103-4 for each one of the port calibration units 101-1, 101-2, 101-3, 101-4. The central switching unit 102 may controllably couple at least two of the input ports 103-1, 103-2, 103-3, 103-4 to each other in pairs.

Port calibration unit 101-1 is exemplarily shown in more detail. It is understood, that port calibration units 101-2, 101-3, 101-4 may be identical to port calibration unit 101-1. Port calibration unit 101-1 comprises a device coupling port 105 for coupling the port calibration unit 101-1 to the respective port 198-1 of the measurement application device 199. Further, port calibration unit 101-1 comprises a central coupling port 106 for coupling the port calibration unit 101-1 to the respective input port 103-1 of the central switching unit 102. In addition, port calibration unit 101-1 comprises a calibration section 107 that comprises at least three calibration standards 108-1, 108-2, 108-3, and a switching section 109 that controllably couples the device coupling port 105 of the port calibration unit 101-1 or the central coupling port 106 of the port calibration unit 101-1 to one of the calibration standards 108-1, 108-2, 108-3, or that controllably couples the device coupling port 105 of the port calibration unit 101-1 to the central coupling port 106 of the port calibration unit 101-1.

The calibration system 100, only as a possible option, comprises a substrate 110. The substrate 110 may be a single substrate that accommodates the port calibration units 101-1, 101-2, 101-3, 101-4, and the central switching unit 102. On such a substrate 110, the port calibration units 101-1, 101-2, 101-3, 101-4 and the central switching unit 102 may be provided as dedicated elements or integrated circuits. The port calibration units 101-1, 101-2, 101-3, 101-4 may be provided on the edges or in the corners of such a substrate 110.

In other embodiments, the port calibration units 101-1, 101-2, 101-3, 101-4 and the central switching unit 102 may be provided as a single integrated circuit, especially as a Monolithic Microwave Integrated Circuit. In other embodiments, the port calibration units 101-1, 101-2, 101-3, 101-4 may be provided as dedicated elements on another substrate than the central switching unit 102, or integrated into the measurement application device 199.

With the arrangement shown in FIG. 1, every one of the ports 198-1-198-4 of the measurement application device 199 may easily be coupled with any other port 198-1-198-4 and with any one of the calibration standards 108-1, 108-2, 108-3 that are provided in the single port calibration units 101-1, 101-2, 101-3, 101-4.

It is understood, that the calibration system 100 is just exemplarily shown with four port calibration units 101-1, 101-2, 101-3, 101-4. In other embodiments, a calibration system may comprise any number of port calibration units, and the central switching unit may comprise a respective number of input ports. The number of port calibration units may in embodiments be different than the number of ports of the measurement application device.

Figure 2:
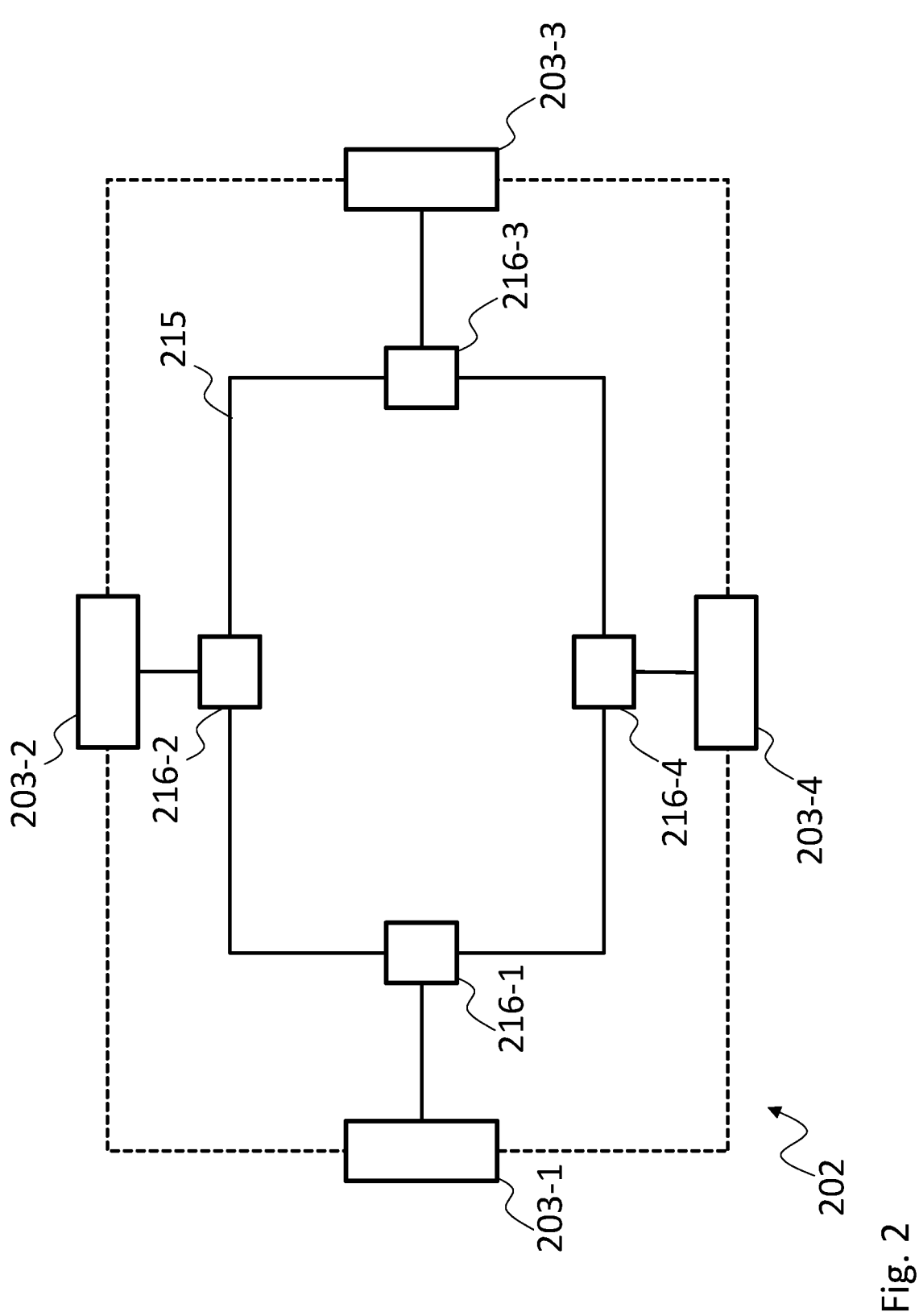
FIG. 2 shows a schematic block diagram of an embodiment of a central switching unit according to the present disclosure.

FIG. 2 shows a schematic block diagram of a central switching unit 202 as it may be used with any embodiment of the calibration system disclosed herein. The central switching unit 202 comprises four exemplary input ports 203-1, 203-2, 203-3, 203-4, wherein any other number of input ports is possible. Further, the central switching unit 202 comprises a ring structure 215. The ring structure 215 comprises four port couplings 216-1, 216-2, 216-3, 216-4, one for each one of the input ports 203-1, 203-2, 203-3, 203-4. Every port coupling 216-1, 216-2, 216-3, 216-4 is coupled to the respective one of the input ports 203-1, 203-2, 203-3, 203-4.

Figure 3:
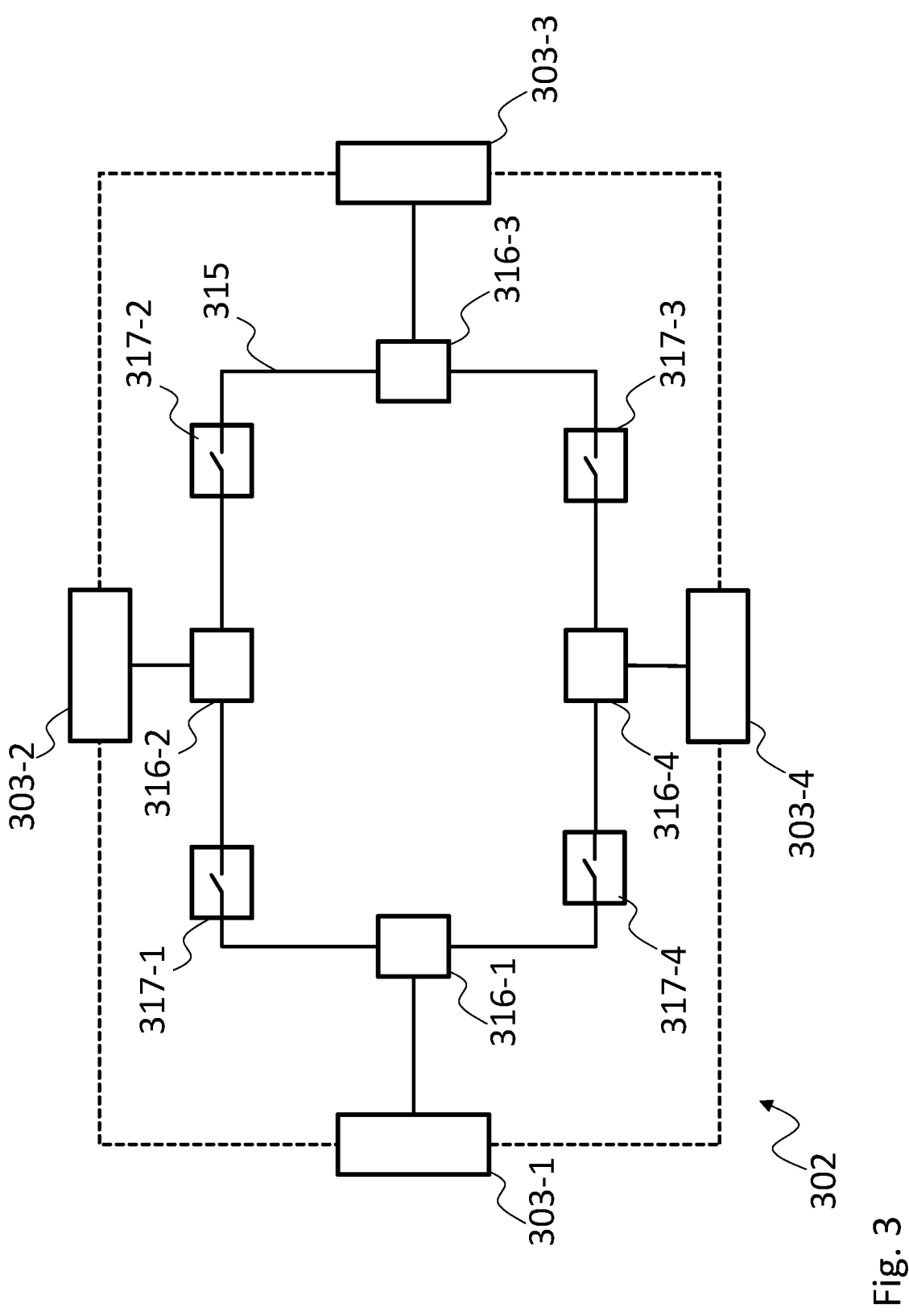
FIG. 3 shows a schematic block diagram of another embodiment of a central switching unit according to the present disclosure.

FIG. 3 shows a schematic block diagram of a central switching unit 302. The central switching unit 302 is based on the central switching unit 202. Therefore, the central switching unit 302 comprises four exemplary input ports 303-1, 303-2, 303-3, 303-4, wherein any other number of input ports is possible. Further, the central switching unit 302 comprises a ring structure 315. The ring structure 315 comprises four port couplings 316-1, 316-2, 316-3, 316-4, one for each one of the input ports 303-1, 303-2, 303-3, 303-4. Every port coupling 316-1, 316-2, 316-3, 316-4 is coupled to the respective one of the input ports 303-1, 303-2, 303-3, 303-4. The explanations provided herein regarding any one of the embodiments of the central switching unit apply to the central switching unit 302 mutatis mutandis.

In addition, the central switching unit 302 comprise a ring switching element 317-1, 317-2, 317-3, 317-4 for each segment of the ring structure 315. In the central switching unit 302 the ring structure 315 comprises four segments, one segment between each one of the port couplings 316-1, 316-2, 316-3, 316-4, and four respective ring switching elements 317-1, 317-2, 317-3, 317-4.

The ring switching elements 317-1, 317-2, 317-3, 317-4 may each comprise a single switch or a multiple switches at least one of in parallel and in series. The single switches may e.g., comprise transistors.

With the ring switching elements 317-1, 317-2, 317-3, 317-4 it is possible to easily couple single ones of the port couplings 316-1, 316-2, 316-3, 316-4, and therefore, the respective input ports 303-1, 303-2, 303-3, 303-4, to each other electrically. This allows providing the required electrical connections between different ports of the measurement application device, or between a port of the measurement application device and respective calibration standards, as required for performing calibration measurements.

With the ring switching elements 317-1, 317-2, 317-3, 317-4 it is also possible to couple two pairs of port couplings 316-1, 316-2, 316-3, 316-4 to each other, while separating the two pairs from each other. This may e.g., be achieved by closing ring switching elements 317-1, 317-3 and opening ring switching elements 317-2, 317-4.

Figure 4:
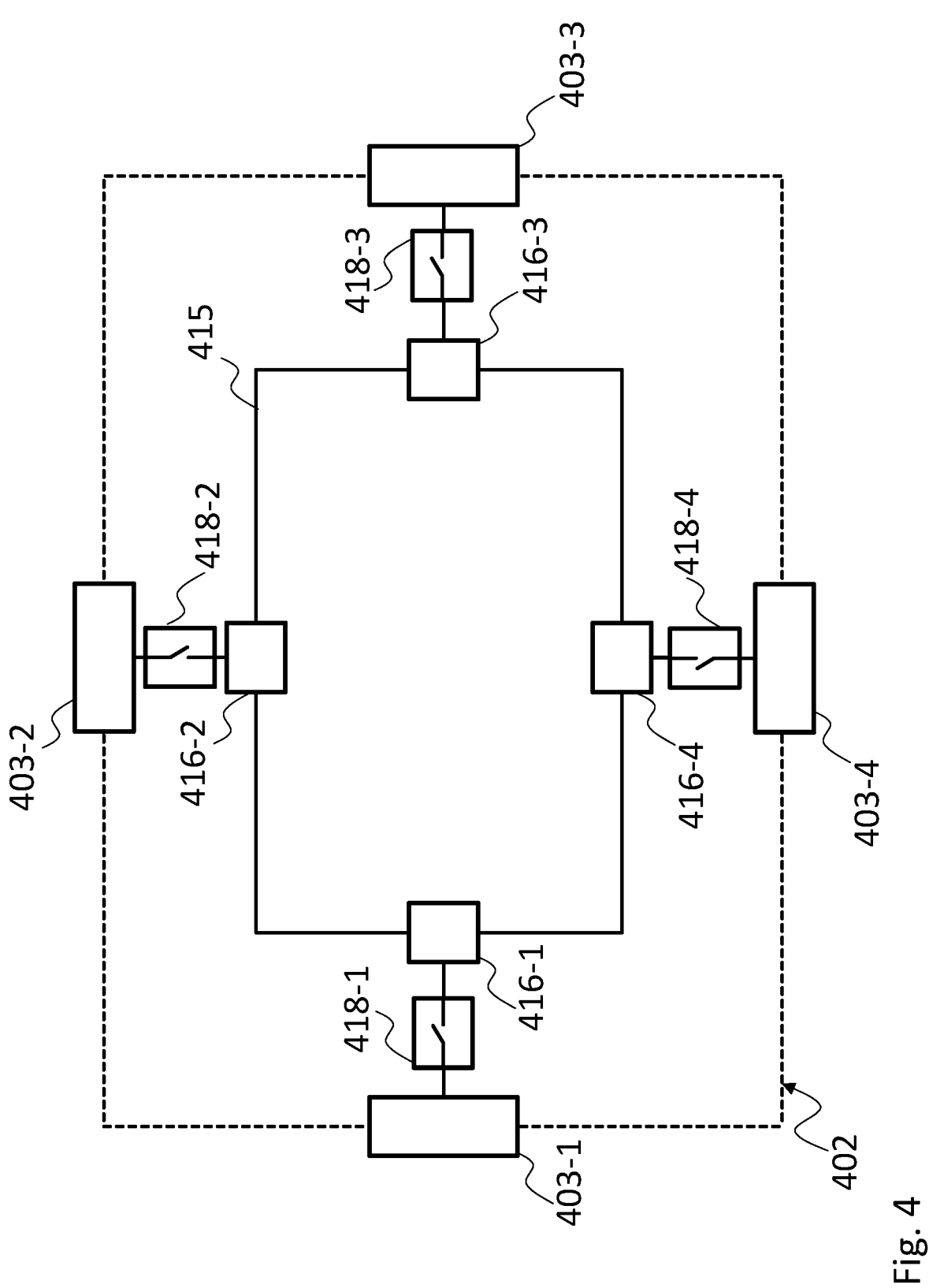
FIG. 4 shows a schematic block diagram of another embodiment of a central switching unit according to the present disclosure.

FIG. 4 shows a schematic block diagram of a central switching unit 402. The central switching unit 402 is based on the central switching unit 202. Therefore, the central switching unit 402 comprises four exemplary input ports 403-1, 403-2, 403-3, 403-4, wherein any other number of input ports is possible. Further, the central switching unit 402 comprises a ring structure 415. The ring structure 415 comprises four port couplings 416-1, 416-2, 416-3, 416-4, one for each one of the input ports 403-1, 403-2, 403-3, 403-4. Every port coupling 416-1, 416-2, 416-3, 416-4 is coupled to the respective one of the input ports 403-1, 403-2, 403-3, 403-4. The explanations provided herein regarding any one of the embodiments of the central switching unit apply to the central switching unit 402 mutatis mutandis.

In addition, the central switching unit 402 comprises a port switching element 418-1, 418-2, 418-3, 418-4 arranged between each one of the port couplings 416-1, 416-2, 416-3, 416-4 and the respective input port 403-1, 403-2, 403-3, 403-4. The port switching elements 418-1, 418-2, 418-3, 418-4 may each comprise a single switch or a multiple switches at least one of in parallel and in series. The single switches may e.g., comprise transistors.

With the port switching elements 418-1, 418-2, 418-3, 418-4 it is possible to controllably couple any one of the input ports 403-1, 403-2, 403-3, 403-4 to the ring structure 415. Consequently, any one of the port calibration units may be coupled to any other one of the port calibration units by closing and opening the respective port switching elements 418-1, 418-2, 418-3, 418-4. By opening the port switching elements 418-1, 418-2, 418-3, 418-4 for the input ports 403-1, 403-2, 403-3, 403-4 that are not required in a measurement, the influences of the respective signal path may be eliminated.

Figure 5:
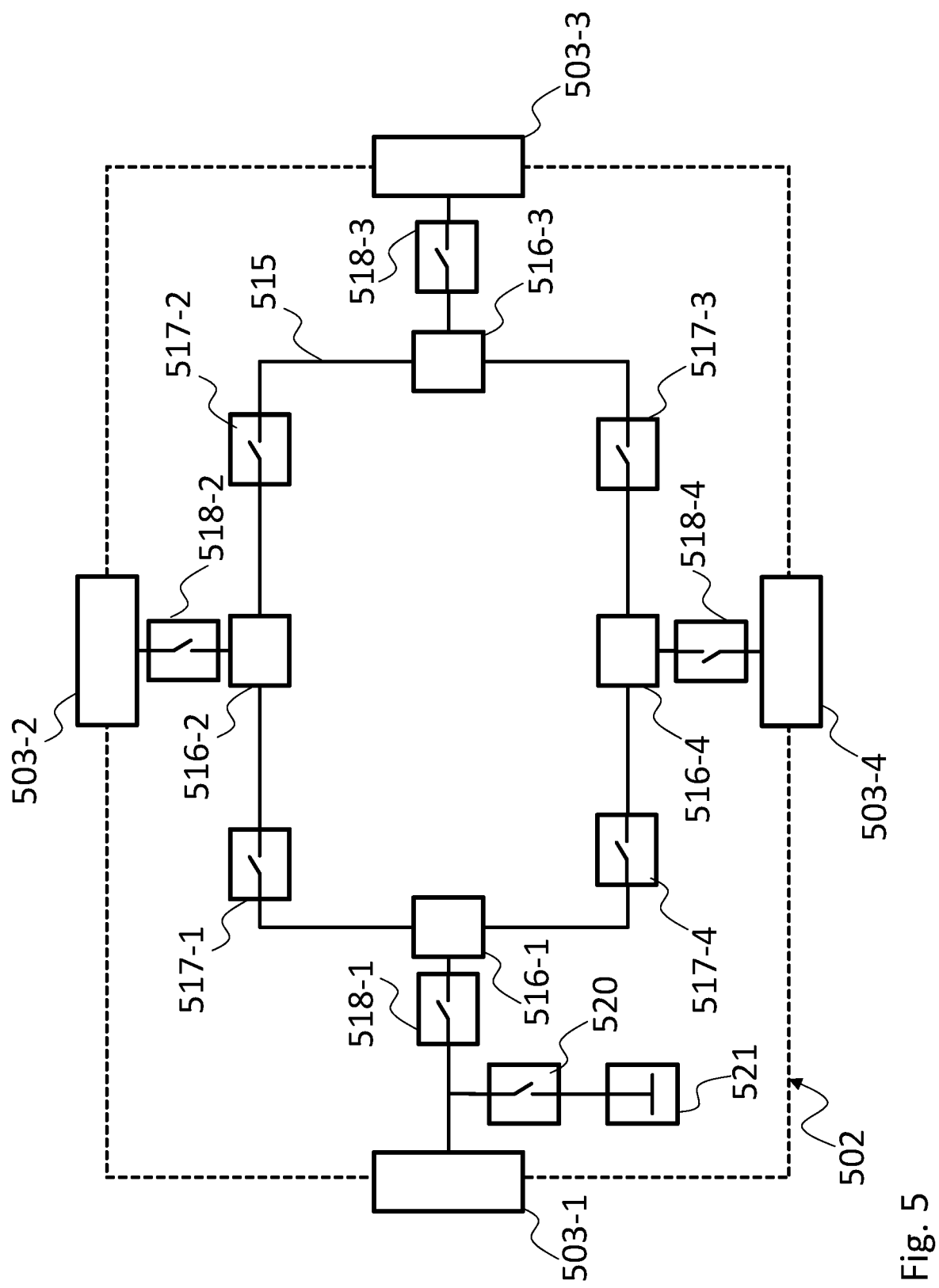
FIG. 5 shows a schematic block diagram of another embodiment of a central switching unit according to the present disclosure.

FIG. 5 shows a schematic block diagram of a central switching unit 502. The central switching unit 502 is based on the central switching unit 202. Therefore, the central switching unit 502 comprises four exemplary input ports 503-1, 503-2, 503-3, 503-4, wherein any other number of input ports is possible. Further, the central switching unit 502 comprises a ring structure 515. The ring structure 515 comprises four port couplings 516-1, 516-2, 516-3, 516-4, one for each one of the input ports 503-1, 503-2, 503-3, 503-4. Every port coupling 516-1, 516-2, 516-3, 516-4 is coupled to the respective one of the input ports 503-1, 503-2, 503-3, 503-4. The explanations provided herein regarding any one of the embodiments of the central switching unit apply to the central switching unit 502 mutatis mutandis.

In addition, the central switching unit 502 comprise a ring switching element 517-1, 517-2, 517-3, 517-4 for each segment of the ring structure 515, as also shown in FIG. 3. In the central switching unit 502 the ring structure 515 comprises four segments, one segment between each one of the port couplings 516-1, 516-2, 516-3, 516-4, and four respective ring switching elements 517-1, 517-2, 517-3, 517-4.

Further, the central switching unit 502 comprises port switching elements 518-1, 518-2, 518-3, 518-4 arranged between each one of the port couplings 516-1, 516-2, 516-3, 516-4 and the respective input port 503-1, 503-2, 503-3, 503-4, as shown in FIG. 4. The port switching elements 518-1, 518-2, 518-3, 518-4 may each comprise a single switch or a multiple switches at least one of in parallel and in series. The single switches may e.g., comprise transistors.

The central switching unit 502 may be seen as a combination of the features of the central switching unit 302, and the central switching unit 402.

In addition, the central switching unit 502 comprises a switch 520 that is coupled to the signal line between input port 503-1 and port switching element 518-1, and to a ground connection 521. The switch 520 may be closed in case that the port switching element 518-1 is opened to provide a defined electrical potential on input port 503-1. The switch 520 and the ground connection 521 are only exemplarily shown for input port 503-1, and may also be provide for any other one of the input ports 503-2, 503-3, 503-4.

Figure 6:
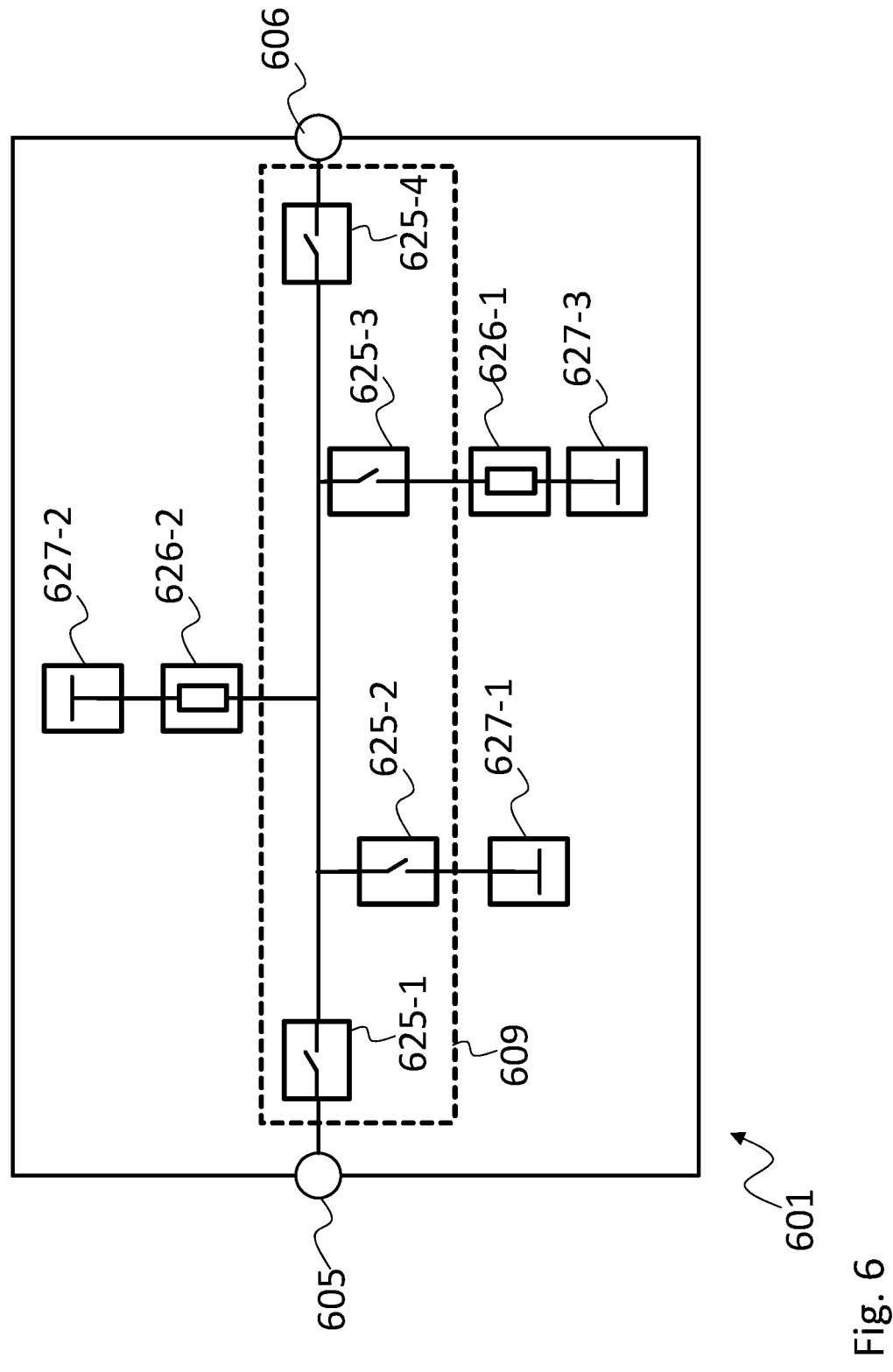
FIG. 6 shows a schematic block diagram of an embodiment of a port calibration unit according to the present disclosure.

FIG. 6 shows a schematic block diagram of a port calibration unit 601. The port calibration unit 601 comprises a device coupling port 605, and a central coupling port 606 together with a switching section 609, and further electrical elements that together provide three calibration standards.

The switching section 609 comprises a switching element 625-1 that is coupled to the device coupling port 605 and to another switching element 625-4. The switching element 625-4 is further coupled to central coupling port 606.

A further switching element 625-2 is coupled to the signal line between switching element 625-1 and switching element 625-4. The switching element 625-2 is further coupled to a ground connection 627-1. Another switching element 625-3 is coupled to the signal line between switching element 625-1 and switching element 625-4. The switching element 625-3 is further coupled to a resistor 626-1. The resistor 626-1 is further coupled to a ground connection 627-3. In addition, an optional resistor 626-2 is coupled to the signal line between switching element 625-1 and switching element 625-4. The resistor 626-2 is further coupled to a ground connection 627-2. Resistor 626-2 serves as a bias resistor that provides a defined electrical potential on the signal line between switching element 625-1 and switching element 625-4.

With the port calibration unit 601 an open calibration standard may be provided on the device coupling port 605 by opening switching element 625-1. A short calibration standard may be provided by closing switching element 625-1, and switching element 625-2, and opening switching element 625-3, and switching element 625-4. A match calibration standard may be provided by closing switching element 625-1, and switching element 625-3, and opening switching element 625-2, and switching element 625-4. The same may be achieved for central coupling port 606 by closing switching element 625-4, and the respective other switching element, while opening switching element 625-1. Further, the device coupling port 605 may be coupled to the central coupling port 606 by closing switching element 625-1 and switching element 625-4, and opening switching element 625-2, and switching element 625-3.

It is understood, that any other type of calibration standard may be provided in the port calibration unit 601 by providing the respective circuit elements in addition or as alternative to the circuit elements already present in the port calibration unit 601.

As shown in FIG. 1, a controller 115 or control unit may be provided in the calibration system. Such a controller 115 may be coupled to every switch or switching element of the calibration system to control the switches as required. Of course, such a controller 115 or control unit may comprise a digital data interface for receiving respective control commands.

FIG. 7 shows a flow diagram of an interfacing method for a measurement application device. The interfacing method may be used as part of a calibration method that may be performed on the measurement application device.

The interfacing method comprises coupling S1 a dedicated port calibration unit to each one of at least two ports of the measurement application device, and controllably coupling S2 two port calibration units to each other in pairs via a central switching unit that comprises an input port for each one of the port calibration units.

Each one of the port calibration units may comprise a device coupling port that couples the respective port calibration unit to the respective port of the measurement application device, and a central coupling port that couples the respective port calibration unit to the respective input port of the central switching unit. Each one of the port calibration units may further comprise a calibration section that comprises at least three calibration standards, and a switching section that controllably couples the device coupling port of the respective port calibration unit or the central coupling port of the respective port calibration unit to one of the at least three calibration standards, or that couples the device coupling port of the respective port calibration unit to the central coupling port of the respective port calibration unit.

Controllably coupling S2 at least two of the input ports to each other in pairs may be performed with a ring structure in the central switching unit that comprises a port coupling for each one of the input ports, wherein each one of the input ports is coupled to a respective one of the port couplings of the ring structure.

For controllably coupling S2, ring switching elements between each two of the port couplings may be provided and controlled to close or open the ring structure between the respective port couplings.

For controllably coupling S2, a port switching element between each one of the port couplings and the respective input ports of the central switching unit may be controlled to couple the respective one of the input ports to the respective port coupling or decouple the respective input port from the respective port coupling.

The at least three calibration standards may comprise at least one of an open calibration standard, a short calibration standard, a match calibration standard, and a high reflection calibration standard.

The interfacing method may further comprise controlling at least one of the port calibration units, and the central switching unit via a controller.

Figure 8:
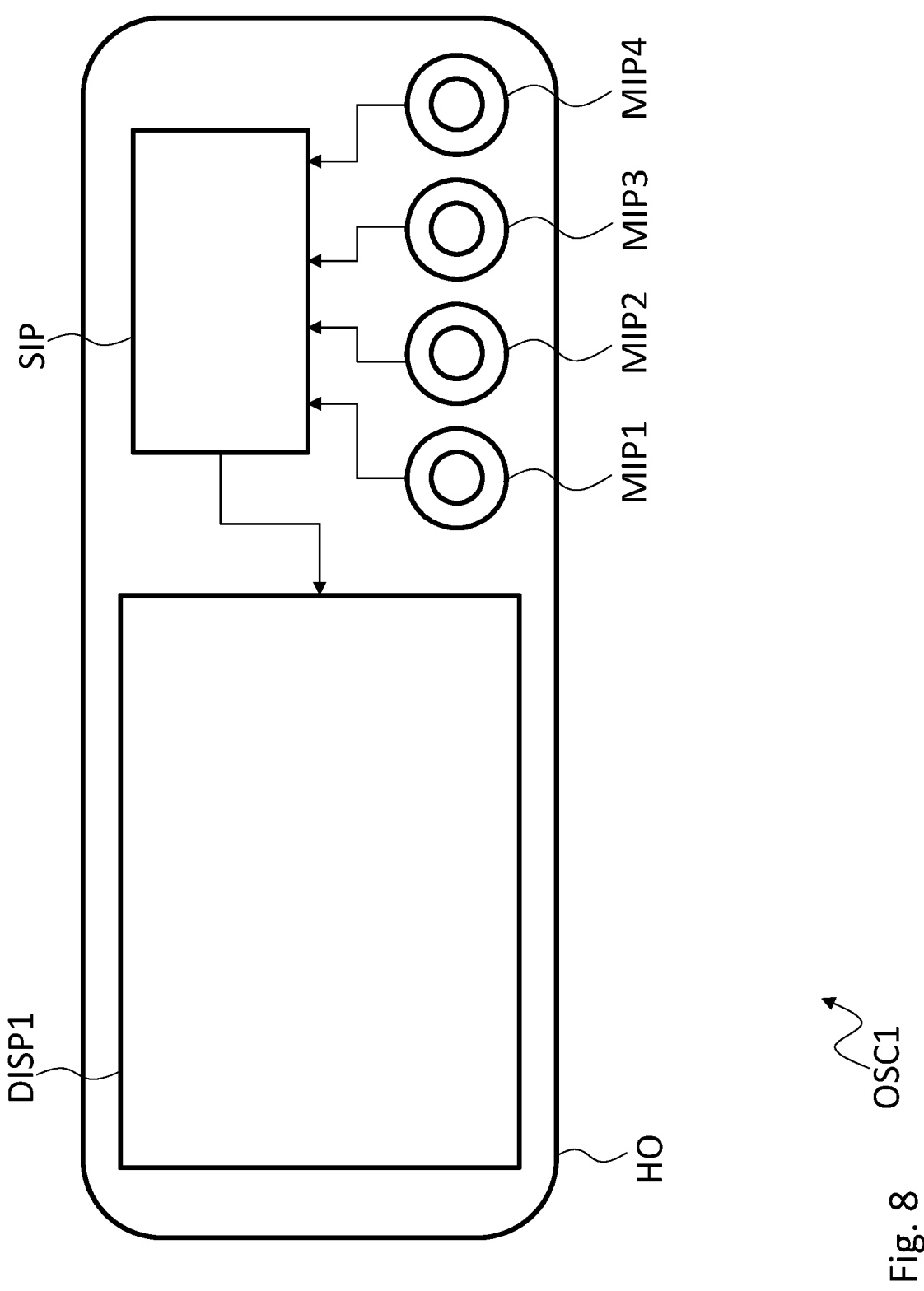
FIG. 8 shows a schematic block diagram of an embodiment of a measurement application device for use with an embodiment of a calibration system according to the present disclosure.

FIG. 8 shows a block diagram of an oscilloscope OSC1 that may be used with an embodiment of a calibration system according to the present disclosure.

The oscilloscope OSC1 comprises a housing HO that accommodates four measurement inputs MIP1, MIP2, MIP3, MIP4 that are coupled to a signal processor SIP for processing any measured signals. The signal processor SIP is coupled to a display DISP1 for displaying the measured signals to a user.

Although not explicitly shown, it is understood, that the oscilloscope OSC1 may also comprise signal outputs. Such signal outputs may for example serve to output calibration signals. Such calibration signals allow calibrating the measurement setup prior to performing any measurement. The process of calibrating and correcting any measurement signals based on the calibration may also be called de-embedding and may comprise applying respective algorithms on the measured signals.

In the oscilloscope OSC1 the signal processor SIP or an additional processing element may perform the function of controller of the calibration system according to the present disclosure, or may implement the controller. Of course, a communication interface may be provided in the oscilloscope OSC1 for communication with other measurement application devices, especially for remotely controlling the controller of the calibration system. The other elements of the calibration system may be added to the signal paths of the oscilloscope OSC1 where appropriate.

Figure 9:
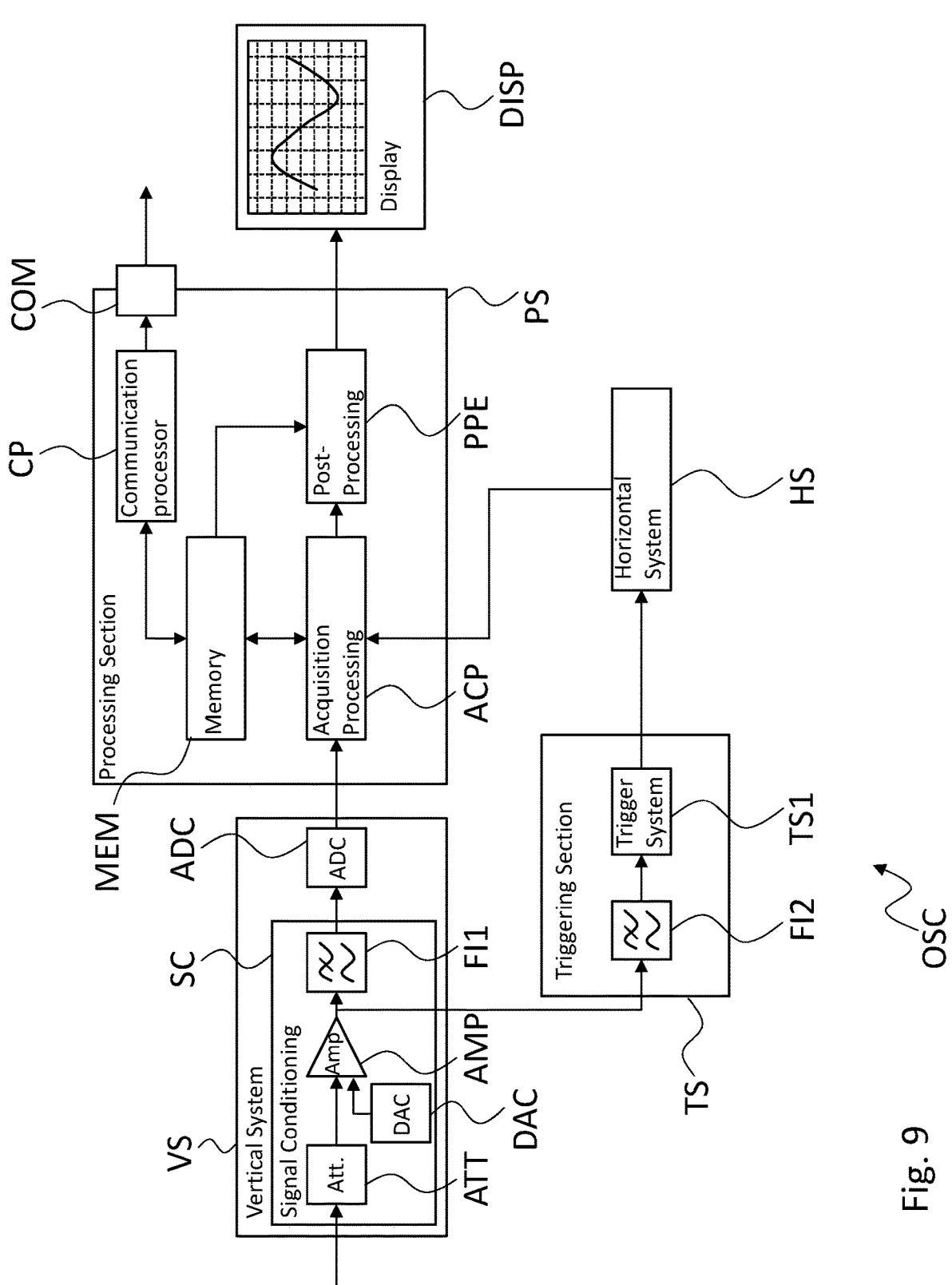
FIG. 9 shows a schematic block diagram of another embodiment of a measurement application device for use with an embodiment of a calibration system according to the present disclosure.

FIG. 9 shows a block diagram of another oscilloscope OSC that may be used with an implementation of a calibration system according to the present disclosure. The oscilloscope OSC is implemented as a digital oscilloscope. However, the present disclosure may also be implemented with any other type of oscilloscope.

The oscilloscope OSC exemplarily comprises five general sections, the vertical system VS, the triggering section TS, the horizontal system HS, the processing section PS and the display DISP. It is understood, that the partitioning into five general sections is a logical partitioning and does not limit the placement and implementation of any of the elements of the oscilloscope OSC in any way.

The vertical system VS mainly serves for offsetting, attenuating and amplifying a signal to be acquired. The signal may for example be modified to fit in the available space on the display DISP or to comprise a vertical size as configured by a user.

To this end, the vertical system VS comprises a signal conditioning section SC with an attenuator ATT and a digital-to-analog-converter DAC that are coupled to an amplifier AMP. The amplifier AMP is coupled to a filter FI1, which in the shown example is provided as a low pass filter. The vertical system VS also comprises an analog-to-digital converter ADC that receives the output from the filter FI1 and converts the received analog signal into a digital signal.

The attenuator ATT and the amplifier AMP serve to scale the amplitude of the signal to be acquired to match the operation range of the analog-to-digital converter ADC. The digital-to-analog-converter DAC serves to modify the DC component of the input signal to be acquired to match the operation range of the analog-to-digital converter ADC. The filter FI1 serves to filter out unwanted high frequency components of the signal to be acquired.

The triggering section TS operates on the signal as provided by the amplifier AMP. The triggering section TS comprises a filter FI2, which in this embodiment is implemented as a low pass filter. The filter FI2 is coupled to a trigger system TS1.

The triggering section TS serves to capture predefined signal events and allows the horizontal system HS to e.g., display a stable view of a repeating waveform, or to simply display waveform sections that comprise the respective signal event. It is understood, that the predefined signal event may be configured by a user via a user input of the oscilloscope OSC.

Possible predefined signal events may for example include, but are not limited to, when the signal crosses a predefined trigger threshold in a predefined direction i.e., with a rising or falling slope. Such a trigger condition is also called an edge trigger. Another trigger condition is called "glitch triggering" and triggers, when a pulse occurs in the signal to be acquired that has a width that is greater than or less than a predefined amount of time.

In order to allow an exact matching of the trigger event and the waveform that is shown on the display DISP, a common time base may be provided for the analog-to-digital converter ADC and the trigger system TS1.

It is understood, that although not explicitly shown, the trigger system TS1 may comprise at least one of configurable voltage comparators for setting the trigger threshold voltage, fixed voltage sources for setting the required slope, respective logic gates like e.g., a XOR gate, and FlipFlops to generate the triggering signal.

The triggering section TS is exemplarily provided as an analog trigger section. It is understood, that the oscilloscope OSC may also be provided with a digital triggering section. Such a digital triggering section will not operate on the analog signal as provided by the amplifier AMP but will operate on the digital signal as provided by the analog-to-digital converter ADC.

A digital triggering section may comprise a processing element, like a processor, a DSP, a CPLD, an ASIC or an FPGA to implement digital algorithms that detect a valid trigger event.

The horizontal system HS is coupled to the output of the trigger system TS1 and mainly serves to position and scale the signal to be acquired horizontally on the display DISP.

The oscilloscope OSC further comprises a processing section PS that implements digital signal processing and data storage for the oscilloscope OSC. The processing section PS comprises an acquisition processing element ACP that is couple to the output of the analog-to-digital converter ADC and the output of the horizontal system HS as well as to a memory MEM and a post processing element PPE.

The acquisition processing element ACP manages the acquisition of digital data from the analog-to-digital converter ADC and the storage of the data in the memory MEM. The acquisition processing element ACP may for example comprise a processing element with a digital interface to the analog-to-digital converter ADC2 and a digital interface to the memory MEM. The processing element may for example comprise a microcontroller, a DSP, a CPLD, an ASIC or an FPGA with respective interfaces. In a microcontroller or DSP, the functionality of the acquisition processing element ACP may be implemented as computer readable instructions that are executed by a CPU. In a CPLD or FPGA the functionality of the acquisition processing element ACP may be configured in to the CPLD or FPGA opposed to software being executed by a processor.

The processing section PS further comprises a communication processor CP and a communication interface COM.

The communication processor CP may be a device that manages data transfer to and from the oscilloscope OSC. The communication interface COM for any adequate communication standard like for example, Ethernet, WIFI, Bluetooth, NFC, an infra-red communication standard, and a visible-light communication standard.

The communication processor CP is coupled to the memory MEM and may use the memory MEM to store and retrieve data.

Of course, the communication processor CP may also be coupled to any other element of the oscilloscope OSC to retrieve device data or to provide device data that is received from the management server.

The post processing element PPE may be controlled by the acquisition processing element ACP and may access the memory MEM to retrieve data that is to be displayed on the display DISP. The post processing element PPE may condition the data stored in the memory MEM such that the display DISP may show the data e.g., as waveform to a user. The post processing element PPE may also realize analysis functions like cursors, waveform measurements, histograms, or math functions.

The display DISP controls all aspects of signal representation to a user, although not explicitly shown, may comprise any component that is required to receive data to be displayed and control a display device to display the data as required.

It is understood, that even if it is not shown, the oscilloscope OSC may also comprise a user interface for a user to interact with the oscilloscope OSC. Such a user interface may comprise dedicated input elements like for example knobs and switches. At least in part the user interface may also be provided as a touch sensitive display device.

In the oscilloscope OSC, any one of the processing elements in the processing section PS or an additional processing element may perform the function controller of the calibration system according to the present disclosure. The other elements of the calibration system may be added to the signal paths of the oscilloscope OSC where appropriate.

It is understood, that all elements of the oscilloscope OSC that perform digital data processing may be provided as dedicated elements. As alternative, at least some of the above-described functions may be implemented in a single hardware element, like for example a microcontroller, DSP, CPLD or FPGA. Generally, the above-describe logical functions may be implemented in any adequate hardware element of the oscilloscope OSC and not necessarily need to be partitioned into the different sections explained above.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, to the extent any embodiments are described as less desirable than other embodiments or prior art implementations with respect to one or more characteristics, these embodiments are not outside the scope of the disclosure and can be desirable for particular applications.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The abstract of the disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

LIST OF REFERENCE SIGNS

100 calibration system
101-1, 101-2, 101-3, 101-4, 601 port calibration unit

102, 202 central switching unit
103-1, 103-2, 103-3, 103-4 input port
203-1, 203-2, 203-3, 203-4 input port
303-1, 303-2, 303-3, 303-4 input port
403-1, 403-2, 403-3, 403-4 input port
503-1, 503-2, 503-3, 503-4 input port
105, 605 device coupling port
106, 606 central coupling port
107 calibration section
108-1, 108-2, 108-3 calibration standard
109, 609 switching section
110 substrate
215, 315, 415, 515 ring structure
216-1, 216-2, 216-3, 216-4 port coupling
316-1, 316-2, 316-3, 316-4 port coupling
416-1, 416-2, 416-3, 416-4 port coupling
516-1, 516-2, 516-3, 516-4 port coupling
317-1, 317-2, 317-3, 317-4 ring switching element
517-1, 517-2, 517-3, 517-4 ring switching element
418-1, 418-2, 418-3, 418-4 port switching element
518-1, 518-2, 518-3, 518-4 port switching element
520 switch
521 ground connection
625-1, 625-2, 625-3, 625-4 switching element
626-1, 626-2 resistor
627-1, 627-2, 627-3 ground connection
199 measurement application device
198 port
OSC1 oscilloscope
HO housing
MIP1, MIP2, MIP3, MIP4 measurement input
SIP signal processing
DISP1 display
OSC oscilloscope
VS vertical system
SC signal conditioning
ATT attenuator
DAC1 analog-to-digital converter
amplifier AMP
FI1 filter
DAC digital-to-analog converter
ADC analog-to-digital converter
TS triggering section
AMP2 amplifier
FI2 filter
TS1 trigger system
HS horizontal system
PS processing section
ACP acquisition processing element
MEM memory
PPE post processing element
DISP display

The invention claimed is:

1. A calibration system for a measurement application device, the calibration system comprising:
   a port calibration unit for each one of at least two ports of the measurement application device; and
   a central switching unit that comprises an input port for each one of the port calibration units and controllably couples at least two of the input ports to each other;
   wherein each one of the port calibration units comprises a device coupling port for coupling the respective port calibration unit to the respective port of the measurement application device, and a central coupling port for coupling the respective port calibration unit to the respective input port of the central switching unit; and wherein each one of the port calibration units comprises a calibration section that comprises at least three calibration standards, and a switching section for controllably coupling the device coupling port of the respective port calibration unit or the central coupling port of the respective port calibration unit to one of the at least three calibration standards, or for coupling the device coupling port of the respective port calibration unit to the central coupling port of the respective port calibration unit.

2. The calibration system according to claim 1, wherein the central switching unit comprises a ring structure with a port coupling for each one of the input ports, wherein each one of the input ports is coupled to a respective one of the port couplings of the ring structure.

3. The calibration system according to claim 2, wherein the ring structure comprises a ring switching element between each two of the port couplings for controllably closing or opening the ring structure between the respective port couplings.

4. The calibration system according to claim 2, wherein the central switching unit comprises a port switching element between each one of the port couplings and the respective input port for controllably coupling the respective input port to the respective port coupling or decoupling the respective input port from the respective port coupling.

5. The calibration system according to claim 1, wherein the port calibration units and the central switching unit are provided as dedicated circuit elements at least one of on separate substrates and coupled to each other by cables, or on the same substrate and coupled to each other by traces provided on the substrate.

6. The calibration system according to claim 1, wherein the port calibration units and the central switching unit are provided in a single element.

7. The calibration system according to claim 6, wherein the single element comprises a Monolithic Microwave Integrated Circuit.

8. The calibration system according to claim 7, wherein the Monolithic Microwave Integrated Circuit comprises a rectangular shape, and wherein the central switching unit is provided in a center of the rectangular shape, and wherein the port calibration units are provided in corners of the rectangular shape or on sides of the rectangular shape.

9. The calibration system according to claim 1, wherein the at least three calibration standards comprise at least one of an open calibration standard, a short calibration standard, a match calibration standard, or a high reflection calibration standard.

10. The calibration system according to claim 1, further comprising a controller that controls at least one of the port calibration units, and the central switching unit.

11. An interfacing method for a measurement application device, the interfacing method comprising:
    coupling a dedicated port calibration unit to each one of at least two ports of the measurement application device; and
    controllably coupling two port calibration units to each other via a central switching unit that comprises an input port for each one of the port calibration units,
    wherein each one of the port calibration units comprises a device coupling port that couples the respective port calibration unit to the respective port of the measurement application device, and a central coupling port that couples the respective port calibration unit to the respective input port of the central switching unit, and
    wherein each one of the port calibration units comprises a calibration section that comprises at least three calibration standards, and a switching section that controllably couples the device coupling port of the respective port calibration unit or the central coupling port of the respective port calibration unit to one of the at least three calibration standards, or that couples the device coupling port of the respective port calibration unit to the central coupling port of the respective port calibration unit.

12. The interfacing method according to claim 11, wherein controllably coupling at least two of the input ports to each other is performed with a ring structure in the central switching unit, wherein the ring structure comprises a port coupling for each one of the input ports.

13. The interfacing method according to claim 12, wherein for controllably coupling ring switching elements between each two of the port couplings are provided and controlled to close or open the ring structure between the respective port couplings.

14. The interfacing method according to claim 12, wherein for controllably coupling a port switching element between each one of the port couplings and the respective input ports of the central switching unit is controlled to couple the respective one of the input ports to the respective port coupling or decouple the respective input port from the respective port coupling.

15. The interfacing method according to claim 11, wherein the at least three calibration standards comprise at least one of an open calibration standard, a short calibration standard, a match calibration standard, or a high reflection calibration standard.

16. The interfacing method according to claim 11, further comprising controlling at least one of the port calibration units, and the central switching unit via a controller.

* * * * *